United States Patent [19]
Ranchy et al.

[11] Patent Number: 6,084,771
[45] Date of Patent: Jul. 4, 2000

[54] POWER ELECTRONIC MODULE AND POWER ELECTRONIC DEVICE INCLUDING SUCH MODULES

[75] Inventors: Eric Ranchy, Clamart; Alain Petitbon, St Arnoult en Yvelines, both of France

[73] Assignee: Alcatel, Paris, France

[21] Appl. No.: 09/099,948

[22] Filed: Jun. 19, 1998

[30] Foreign Application Priority Data

Jun. 19, 1997 [FR] France .................................. 97 07637

[51] Int. Cl.⁷ .................................................. H05K 7/20
[52] U.S. Cl. ...................... 361/699; 361/701; 361/688; 361/689; 361/704; 361/707; 361/715; 361/716; 361/721; 174/15.1; 165/80.4; 165/185
[58] Field of Search .................................. 361/689, 690, 361/696–704, 707, 712, 715, 716, 719–721; 257/718, 719, 727; 174/15.1, 15.2, 16.1, 16.3; 165/80.2–80.4, 104.33, 104.34, 185

[56] References Cited

U.S. PATENT DOCUMENTS

| | | | |
|---|---|---|---|
| 4,716,498 | 12/1987 | Ellis ........................................ | 361/715 |
| 4,878,106 | 10/1989 | Sachs . | |
| 4,916,575 | 4/1990 | Van Asten ................................ | 361/715 |
| 5,181,167 | 1/1993 | Davidson et al. ....................... | 361/699 |
| 5,424,919 | 6/1995 | Hielbronner ............................ | 361/710 |
| 5,608,610 | 3/1997 | Brzezinski .............................. | 361/704 |

FOREIGN PATENT DOCUMENTS

29504352U1  9/1995  Germany .

OTHER PUBLICATIONS

Patent Abstracts of Japan. vol. 018. No. 531 (E–1614), Oct. 7, 1994 corresponding to JP 06 188363 A (Mitsubishi Electric Corp) dated Jul. 8, 1994.

Patent Abstracts of Japan, vol. 018. No. 556 (E–1620), Oct. 24, 1994 corresponding to JP 06 204398 A (NEC Corp) dated Jul. 22, 1994.

*Primary Examiner*—Leo P. Picard
*Assistant Examiner*—Boris L. Chervinsky
*Attorney, Agent, or Firm*—Sughrue, Mion, Zinn, Macpeak & Seas, PLLC

[57] ABSTRACT

The invention concerns a power electronic module comprising two individual modules (1) each comprising a power electronic component (5) having a contact face (6) mounted on a metallic face (7) of a substrate (8), power connections (11, 13, 20) a metallic heat exchanger (2) mounted on the other face (12) of the substrate (8).

In accordance with the invention the two individual modules (1) are face to face, the power electronic component (5) of one individual module (1) facing the power electronic component (5) of the other individual module (1), and separated from each other by at least one spacer (3) comprising control leads (14) for controlling the individual modules (1) and power leads (13) for transmitting power to the individual modules (1) or between individual modules (1).

7 Claims, 1 Drawing Sheet

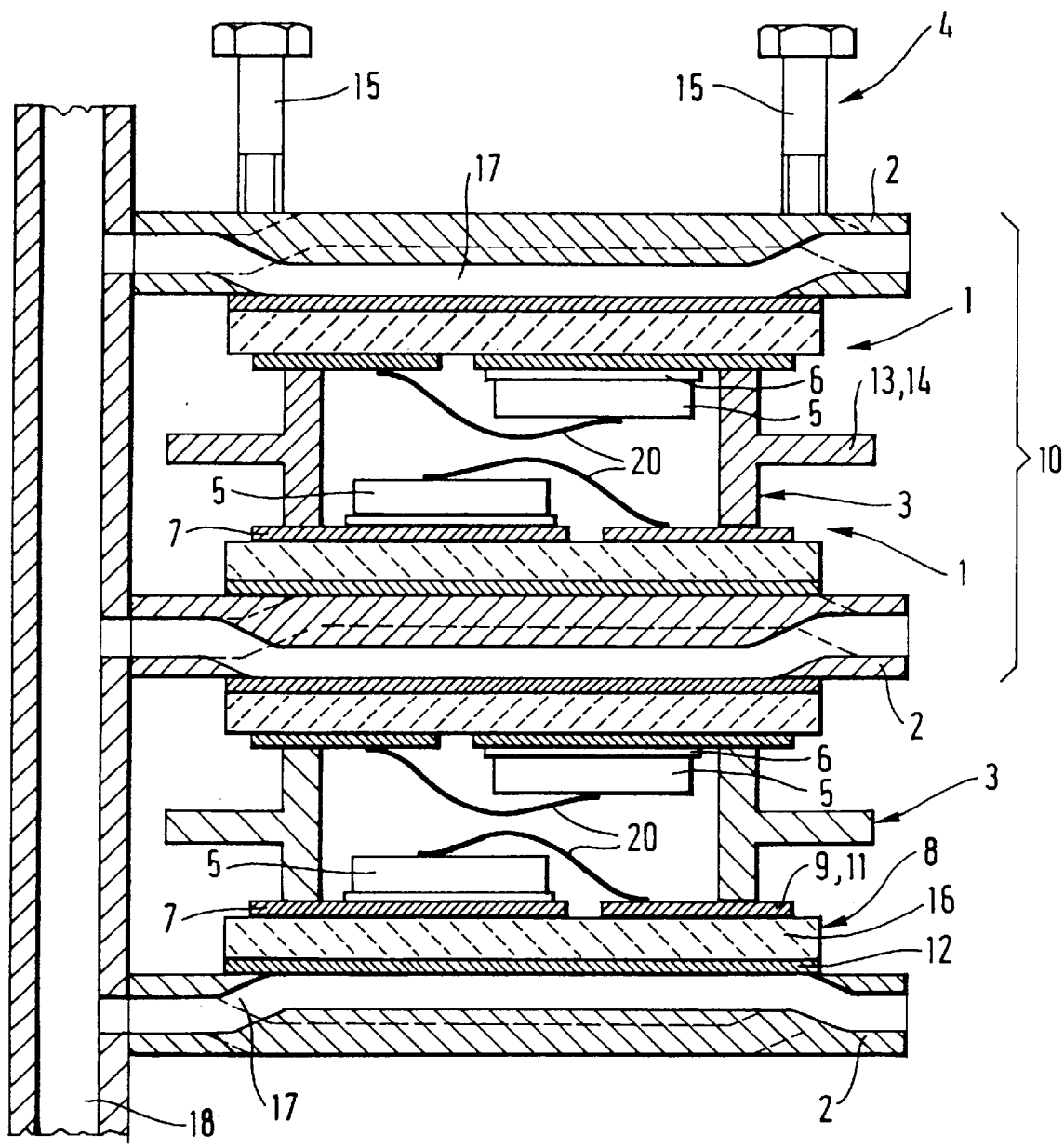

POWER ELECTRONIC MODULE AND POWER ELECTRONIC DEVICE INCLUDING SUCH MODULES

The invention concerns a power electronic module and a power electronic device including such modules. In particular, the present invention concerns a power electronic module comprising standard materials fabricated by standard methods.

Developments in the field of power electronics include:
reducing the size of devices, for example by reducing the size of cooling members by improving the evacuation of heat generated by the power electronic components,
using modular concepts so that power can be increased by adding similar modules, and
using standard fabrication techniques and materials to reduce production costs.

U.S. Pat. No. 5,296,739 concerns a power electronic device comprising a plate supporting a power electronic component. The plate comprises a metallic layer in contact with a cooling member. The plate further comprises conductive tracks for connecting the electronic power component using connecting wires. Thermal contact is assured by a presser member forcing mechanical contact between the metalized plate and the cooling member.

A first drawback of U.S. Pat. No. 5,296,739 results from the fact that the presser member is bulky and has no functions other than pressing.

Another drawback of U.S. Pat. No. 5,296,739 results from the limited modularity of the device.

Another drawback of U.S. Pat. No. 5,296,739 results from the volume of the cooling member and its lack of modularity.

One aim of the present invention is to propose a power electronic module based on the principle of contact by pressure but having a more ergonomic arrangement, in terms of modularity and reduced volume, of the presser device and the cooling members.

To this end the invention concerns a power electronic module comprising two individual modules each comprising at least one power electronic component having at least one contact face mounted on one face of a substrate, control connections for connecting the component to a control module, power connections for transmitting power between components and/or to other individual modules and at least one metallic heat exchanger for evacuating the power dissipated by the power electronic component because of the Joule effect mounted on the other face of the substrate.

In accordance with the invention the two individual modules are face to face, the power electronic components of each individual module facing each other, the two individual modules being separated from each other by at least one spacer comprising control tracks for controlling the individual modules and power tracks for transmitting power to the individual modules or between individual modules.

The power electronic module comprises clamping means for fastening the individual modules to the spacer by clamping.

In one embodiment the substrate is DBC (Direct Bond Copper).

The metallic heat exchanger comprises a heat-conveying fluid circulation circuit.

The metallic face of the substrate in contact with the heat exchanger constitutes one wall of the circulation circuit of said heat exchanger.

The invention also concerns a power electronic device comprising a plurality of modules as described hereinabove stacked one on the other and fastened together by clamping means.

Two adjacent modules advantageously share a common metallic heat exchanger.

A first advantage of the present invention is placing the individual modules face to face, separated by a spacer comprising power and control tracks. Accordingly, the presser member of one individual module consists of the spacer and the other individual module. The resulting saving of space is considerable.

Another advantage is the result of the fact that in a power electronic device in accordance with the invention two adjacent modules share a common metallic heat exchanger. Once again the reduction in volume is considerable. Furthermore, there is only one cooling fluid circulation device because the various metallic heat exchangers are interconnected by pipes.

Another advantage of the present invention results from the real modularity of the device.

Other advantages and features of the present invention will emerge from the following description with reference to the single FIGURE which is a diagram representing a modular electronic device in accordance with the present invention.

A power electronic module in accordance with the invention comprises two individual modules 1 each comprising at least one power electronic component 5 having at least one contact face 6 mounted on a metalized first face 7 of an electrically insulative substrate 8. The substrate 8 further comprises metalized tracks 9 for control connections for connecting the component(s) 5 to a control module (not shown) and power tracks 11 for transmitting power between components 5 and/or to other individual modules 1. The substrate 8 further comprises a second metalized face 12 opposite the first face 7 disposed in contact with a metallic heat exchanger 2 to evacuate the power dissipated by the power electronic component(s) 5 due to the Joule effect.

The two individual modules 1 constituting the module of the invention are face to face with the power electronic components 5 facing each other.

The two individual modules are separated from each other by at least one spacer 3 comprising control leads 14 for transmitting commands of the individual modules 1 and power leads 13 for transmitting power to the individual modules 1 or between individual modules 1.

As shown in the FIGURE, the power leads 13 or control leads 14 are advantageously respectively connected to the power tracks 11 and control tracks 9 themselves connected to the components 5 of the individual modules 1 by conventional connections 20.

The power electronic components 5 of the individual modules 1 are soldered to the first metalized face 7 using standard soldering techniques.

Clamping means 4 fasten the individual modules 1 to the spacer 3 by clamping. For example, the spacer 3 is held perfectly between the two individual modules 1 acting as flanges, tie-rods 15 through them assuring the clamping.

The substrate 8 can advantageously be of DBC. In a manner known in itself the DBC comprises two faces 9, 11, 7; 12 metalized with copper separated by an electrically insulative ceramic layer 16.

To improve the transfer of heat the metallic heat exchangers 2 comprise a heat-conveying fluid circulation circuit 17.

In the embodiment shown in the FIGURE the metallic face 12 in contact with the heat exchanger 2 constitutes one wall of the circulation circuit 17 of said heat exchanger 2. This reduces the number of interfaces between the component 5 and the heat-conveying fluid and so improves heat transfer.

In the embodiment shown, the heat-conveying fluid circulation circuits 17 are connected to a common manifold 18. This means that a single device for circulating and recycling the cooling fluid (not shown) can be used for all of the module or the multi-module device.

In the invention also concerns a power electronic device comprising a plurality of modules 10 as described hereandabove stacked one on the other and fastened together by clamping means 4. In this case the two end individual modules 1 of the end modules 10 act as flanges and the tie-rods 15 press together the individual modules 1 and the interleaved spacers 3.

In the embodiment shown in the FIGURE, two adjacent individual modules 1 of two different modules 10 have a common metallic heat exchanger 2.

Of course, the invention is not limited to the embodiment described and shown and many variants within the scope of the invention will suggest themselves to the skilled person.

What is claimed is:

1. A power electronic module comprising two individual modules (1) each comprising at least one power electronic component (5) having at least one contact face (6) mounted on a metallic face (7) of a substrate (8), control connections (9, 14, 20), power connections (11, 13, 20) for transmitting power between components (5) or to other individual modules (1) and at least one metallic heat exchanger (2) for evacuating the power dissipated by the power electronic component (5) due to the Joule effect, said metallic heat exchanger (2) being mounted on another face (12) of the substrate (8), wherein the two individual modules (1) are face to face, the power electronic component (5) of one individual module (1) facing the power electronic component (5) of the other individual module (1), and separated from each other by at least one spacer (3) comprising control leads (14) for controlling the individual modules (1) and power leads (13) for transmitting power to the individual modules (1) or between individual modules (1).

2. A power electronic module according to claim 1 characterized in that it comprises clamping means (4) for fastening the individual modules (1) to the spacer (3) by clamping.

3. A power electronic module according to claim 1 characterized in that the substrate (8) is of direct bonded copper-type comprising two faces (9, 11, 7; 12) metalized with copper separated by an electrically insulative ceramic layer (16).

4. A power electronic module according to claim 1 characterized in that the metallic heat exchanger (2) comprises a heat-conveying fluid circulation circuit (17).

5. A power electronic module according to claim 4 characterized in that the metallic face (12) of the substrate (8) in contact with the heat exchanger (2) constitutes one wall of the circulation circuit (17) of said heater exchanger (2).

6. A power electronic device comprising a plurality of modules (10) stacked one on the other and fastened together by clamping means (4), each of said modules including at least one power electronic component (5) having at least one contact face (6) mounted on a metallic face (7) of a substrate (8), control connections (9, 14, 20), power connections (11, 13, 20) for transmitting power between components (5) or to other individual modules (1) and at least one metallic heat exchanger (2) for evacuating the power dissipated by the power electronic component (5) due to the Joule effect, said metallic heat exchanger (2) being mounted on another face (12) of the substrate (8), wherein the two individual modules (1) are face to face, the power electronic component (5) of one individual module (1) facing the power electronic component (5) of the other individual module (1), and separated from each other by at least one spacer (3) comprising control leads (14) for controlling the individual modules (1) and power leads (13) for transmitting power to the individual modules (1) or between individual modules (1).

7. A power electronic device according to claim 6 characterized in that two adjacent individual modules of two different modules (10) have a common metallic heat exchanger (20).

* * * * *